United States Patent
Bayer et al.

(10) Patent No.: US 8,558,537 B2
(45) Date of Patent: Oct. 15, 2013

(54) METHOD TO TEST THE MEASUREMENT ACCURACY OF AT LEAST ONE MAGNETIC FIELD SENSOR USING A SEMICONDUCTOR CHIP HAVING A MEASUREMENT COIL

(75) Inventors: Martin Bayer, Vörstetten (DE); Hans-Jörg Fink, Freiburg (DE)

(73) Assignee: Micronas GmbH, Freiburg I.Br. (DE)

( * ) Notice: Subject to any disclaimer, the term of this patent is extended or adjusted under 35 U.S.C. 154(b) by 1381 days.

(21) Appl. No.: 11/949,393

(22) Filed: Dec. 3, 2007

(65) Prior Publication Data
US 2009/0015242 A1  Jan. 15, 2009

(30) Foreign Application Priority Data
Dec. 4, 2006 (DE) .......................... 10 2006 057 385

(51) Int. Cl.
*G01R 35/00* (2006.01)

(52) U.S. Cl.
USPC ............ 324/202; 324/234; 324/239; 324/262

(58) Field of Classification Search
USPC ............ 324/202, 262, 249, 251, 252; 29/593
See application file for complete search history.

(56) References Cited

U.S. PATENT DOCUMENTS

| | | | | |
|---|---|---|---|---|
| 5,514,953 | A * | 5/1996 | Schultz et al. | 324/228 |
| 7,183,763 | B1 * | 2/2007 | Murata | 324/212 |
| 7,345,470 | B2 | 3/2008 | Suzuki | |
| 2006/0049823 | A1 | 3/2006 | Suzuki | |
| 2009/0079449 | A1 * | 3/2009 | Marbler | 324/754 |

* cited by examiner

*Primary Examiner* — Jermele M Hollington
*Assistant Examiner* — David M. Schindler
(74) *Attorney, Agent, or Firm* — Muncy, Geissler, Olds & Lowe, PLLC (57) ABSTRACT

In a process for testing the measurement accuracy of at least one magnetic field sensor, in particular during manufacturing, a semiconductor wafer that has at least two semiconductor chips is provided. A measurement coil is integrated into at least one first semiconductor chip, and a magnetic field-sensitive electric circuit is integrated into at least one second semiconductor chip that forms the magnetic field sensor. The first semiconductor chip, of which at least one is present, is positioned at an exciter coil that is supplied with current in order to generate a reference magnetic field. With the aid of the measurement coil a first measured value that is dependent on the magnetic flux density is acquired and the current in the exciter coil is adjusted depending on the first measured value. The second semiconductor chip, of which at least one is present, is positioned at the exciter coil. With the aid of the electronic circuit a second measured value that is dependent on the magnetic flux density is acquired and compared with a reference value range.

28 Claims, 5 Drawing Sheets

METHOD TO TEST THE MEASUREMENT ACCURACY OF AT LEAST ONE MAGNETIC FIELD SENSOR USING A SEMICONDUCTOR CHIP HAVING A MEASUREMENT COIL

FIELD OF THE INVENTION

The invention relates to a method for testing the measurement accuracy of at least one magnetic field sensor, in particular during manufacturing.

BACKGROUND

In a method for testing the measurement accuracy of magnetic field sensors that is known in actual practice, a wafer that contains a plurality of semiconductor chips in the form of magnetic field sensors in which a Hall effect sensor circuit is integrated is prepared. The individual semiconductor chips each have electrical connection contacts that can be connected to matching contacts on a test instrument. The semiconductor chips are positioned one after another on an exciter coil, which is supplied with a specified current by means of a current source in order to generate a reference magnetic field. The semiconductor chip that is located on the exciter coil is connected by means of the connection contacts to the matching contacts of the test instrument in order to supply current to the semiconductor chip and to acquire a measured value for the magnetic flux density in the reference magnetic field and to transfer it to the test instrument. In the test instrument the measured value is compared with a specified reference value range. The reference value range is specified as a function of the specified magnetic flow density in the reference magnetic field and the measurement accuracy required for the Hall effect sensor. If a deviation between the measured value and the reference value range occurs, the Hall effect sensor in question is marked with a colored dot. After the Hall effect sensors that are located on the wafer have been tested in this way, the semiconductor chips are singulated by dividing the wafer along predefined scribe lines running between the semiconductor chips. The marked semiconductor chips are culled out as defective. The remaining semiconductor chips are connected by means of bond wires to the contact lugs provided on a lead frame and are then surrounded by a plastic housing in such a way that the free ends of the contact lugs extend out of the plastic. With the aid of the contact lugs, the resulting magnetic field sensors may be soldered, for example, to the lead tracks of a circuit board.

This method has the disadvantage that the testing of the measurement accuracy of the magnetic field sensors is subject to a series of factors that can cause errors that limit measurement accuracy. For example, the current in the exciter coil and therefore the magnetic flux density of the reference magnetic field can deviate from a specified value due to temperature variations in the power source and/or in the exciter coil. In addition, because of positioning tolerances the individual semiconductor chips may be located at different distances from the exciter coil when they are positioned at the exciter coil. The magnetic field sensors that are tested by means of this method therefore have relatively wide tolerances. In safety-related applications, such as magnetic field sensors to report the position of a butterfly valve in an internal combustion engine to an electronic engine control unit, however, very tight measured value tolerances are required, and these tolerances cannot be maintained with this method, or they can only be achieved at very great effort and expense.

SUMMARY

The object is therefore to arrive at a process of the type referred to above that permits the measurement accuracy of at least one magnetic field sensor to be precisely tested.

This object is accomplished by a semiconductor wafer that has at least two semiconductor chips, and in which at least one first semiconductor chip a measurement coil is integrated and in at least one second semiconductor chip that forms the magnetic field sensor a magnetic field-sensitive electric circuit is integrated, a first semiconductor chip, of which there is at least one, is positioned at an exciter coil, and current is supplied to the exciter coil in order to generate a first reference magnetic field, with the help of the measurement coil a first measured value, which is dependent on the magnetic flux density, is acquired, and the current in the exciter coil is set depending on the first measured value, the second semiconductor chip, of which there is at least one, is positioned at the exciter coil, and with the aid of the electric circuit a second measured value, which is dependent on the magnetic flux density, is recorded and compared with a reference value range.

Before the magnetic flux density is measured with the aid of at least one magnetic field sensor, the magnetic flux density of the exciter field is checked with the aid of the measurement coil and corrected if necessary. In this way, variations in the flux density of the reference magnetic field are avoided. Since the magnetic coil is located on the same wafer as the magnetic field sensor, of which at least one is present, the measurement coil can, when the first measured value is acquired, in simple manner be arranged in precisely the same distance to the exciter coil as the magnetic field sensor or the second semiconductor chip when the second measured value is acquired. Using the methods of semiconductor manufacturing, the measurement coil can be integrated with high precision into the first semiconductor chip. The method therefore permits high measurement accuracy.

The object referred to above is accomplished by providing a semiconductor wafer that has at least two semiconductor chips is provided, when a measurement coil is integrated into a first semiconductor chip, of which there is at least one, and when, into a second semiconductor chip—of which there is at least one—that forms the magnetic field sensor a magnetic field-sensitive electric circuit the first semiconductor chip—of which there is a least one—is positioned at an exciter coil, and the exciter coil is supplied with current in order to generate a first reference magnetic field, and when with the aid of the measurement coil a first measured value that is dependent on the magnetic flux density is acquired, when, depending on the first measured value, a reference value range is provided, when the second semiconductor chip, of which there is a least one, is positioned at the exciter coil, and when, with the aid of the electric circuit a second measured value that is dependent on the magnetic flux density is acquired and is compared with the reference value range.

In this solution the magnetic flux density is first measured with the aid of the measurement coil, and then the reference value range is determined depending on the result of this measurement. Then a measured value is acquired with the aid of the magnetic field sensor in the reference magnetic field and is compared with the reference value range in order to test the measurement accuracy of the magnetic field sensor. Possible changes in the magnetic flux density of the reference magnetic field are compensated for by adjusting the reference value range.

In a preferred embodiment of the method, the second semiconductor chips are marked depending on the result of the comparison between the second measured value and the reference value range, then they are singulated and sorted according to how they are marked. Semiconductor chips whose measured values lie outside of the specified tolerance band can be culled out in a simple manner. The tolerance band may, for example, be ±1%.

It is advantageous if the electric circuit is designed in such a way that at least two different measurement characteristic curves can be set and that the setting of the measurement characteristic curve is performed depending on the result of the comparison between the second measured value and the reference value range. In this way, relatively small measurement errors in the magnetic field sensors can be completely or partially corrected, so that the magnetic field sensor then lies within the tolerance band.

It is advantageous if the ratio of the number of second semiconductor chips located on the wafer to the number of a first semiconductor chips located on the wafer is greater than 1, in particular greater than 10, optionally greater than 20, and preferably greater than 40. Tests have shown that, even with a wafer on which only about every 50th semiconductor chip has a measurement coil, good measurement accuracy can be achieved with the method. Thus, the surface area available on the wafer can be used almost exclusively for the magnetic field sensors.

In a preferred embodiment of the invention, the semiconductor chips are singulated and in some cases enclosed with a sensor housing after and/or before they are positioned at the exciter coil. The method can also be performed after the semiconductor chips have been individually encapsulated with the housing. It is particularly advantageous if the method of the invention is performed at least twice with each magnetic field sensor, namely a first time when the semiconductor chip of the magnetic field sensor is still attached to the wafer, and a second time after the semiconductor chip of the magnetic field sensor is singulated and enclosed by the housing. In this way, an even greater measurement accuracy can be achieved by the magnetic field sensors that have passed both tests.

It is advantageous if the first semiconductor chips are separated from the second semiconductor chips before the sensor housing is installed. Then the first and second semiconductor chips preferably are installed in an identical housing having the same design. The semiconductor chips that have the exciter coil can then be differentiated in a simple manner from the magnetic field sensors with the aid of an electronic test instrument that applies electric test signals to the connection contacts of the semiconductor chip and detects the response of the semiconductor chip to these test signals. After the method is performed, the magnetic field sensors having the measurement coils are culled out.

After they have been singulated the semiconductor chips preferably are lined up on a belt and the belt is moved in the direction of longitudinal extension in order to position the semiconductor chips at the exciter coil, and they are transported past the exciter coil. The semiconductor chips may be connected to the belt with the aid of contact lugs that contact the semiconductor chips. In this way, the semiconductor chips can be positioned one after another at the exciter coil.

It is advantageous if the connections of the measurement coils integrated into the first semiconductor chips are connected to first connection contacts and the connections of the electric circuit that is integrated into the second semiconductor chip are each connected with second connection contacts, if the position of the first connection contacts relative to the first semiconductor chips corresponds to the position of the second connection contacts relative to the second semiconductor chip or to some of these connection contacts, and if the connection contacts are contacted to matching contacts connected to a test instrument during or after the positioning of the semiconductor chips at the exciter coil. The semiconductor chips having the measurement coil and those having the magnetic field sensors may then be differentiated from each other in a simple manner with the aid of the same test instrument.

In a preferred embodiment of the invention, after the second measured value has been acquired, the temperature of a least one second semiconductor chip is changed, and at least one further second measured value is acquired and compared with the reference value range. In the one measurement the temperature is placed at the lower end of the ambient temperature range specified for the magnetic field sensors and with the other measurement the temperature is set at the upper end of the ambient temperature range.

It is desirable for the exciter coil to be supplied with alternating current when the first semiconductor chip is positioned at the exciter coil and to be supplied with direct current while the second semiconductor chip is positioned at the exciter coil. The magnetic field sensors can then be tested even faster. The amplitude of the alternating current preferably coincides with the amplitude of the direct current.

BRIEF DESCRIPTION OF THE DRAWINGS

Examples of embodiments of the invention are explained further below based on the drawing. The drawing shows.

DETAILED DESCRIPTION

Figure 1:
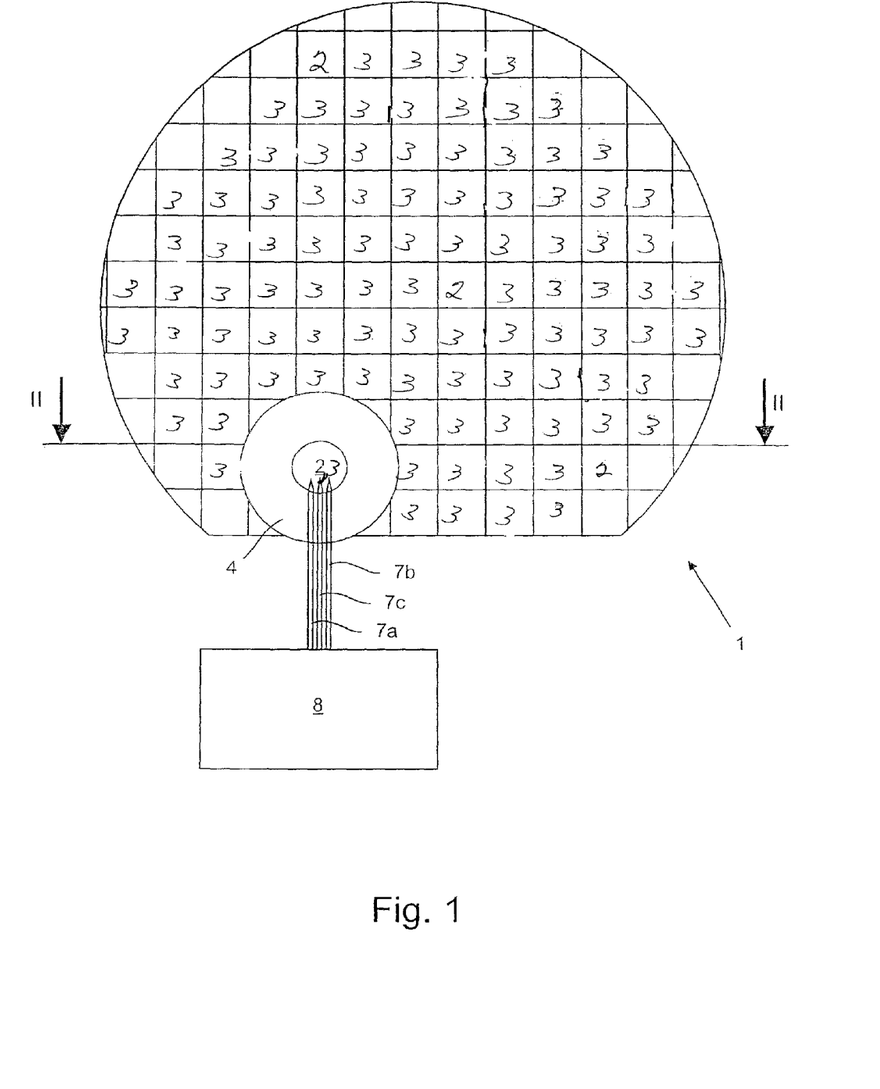
FIG. 1 a top view onto a wafer having a plurality of semiconductor chips for magnetic field sensors that is positioned at an exciter coil for generating a reference magnetic field, FIG. 2 a cross-section through the arrangement shown in FIG. 1 along the plane identified in FIG. 1 with II, FIG. 3 a top view onto a belt on which on which magnetic field sensors are positioned in a row, with one of the magnetic field sensors positioned at an exciter coil to generate a reference magnetic field, FIG. 4 a side view of the arrangement shown in FIG. 3, and FIG. 5 a circuit diagram of a measurement coil connected to an impedance converter.
Figure 2:
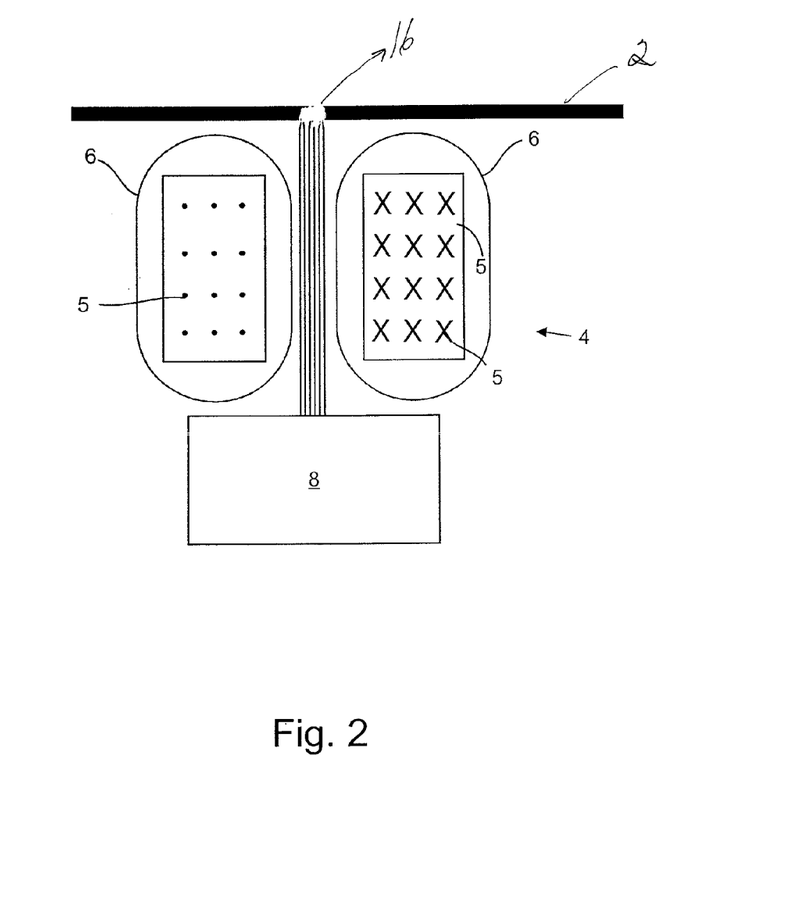

In a method for checking the measurement accuracy of magnetic field sensors during manufacturing in a semiconductor manufacturing facility a semiconductor wafer 1 that has a plurality of first and second semiconductor chips 2, 3 that are arranged in a plurality of rows and columns next to reach other and are connected to reach other to form a single part is prepared.

A measurement coil 16 is integrated into the first semiconductor chip 2. This measurement coil is formed by conductor traces that are placed in the semiconductor substrate of the wafer 1 or are deposited onto the substrate using semiconductor manufacturing methods. The ends of the measurement coil 16 are connected to connection contacts located on the surface of the semiconductor chip 2.

A magnetic field-sensitive electric circuit, namely a Hall effect sensor circuit, which is known per se, is integrated into the second semiconductor chip 3. At least two different measurement characteristic curves are programmable in the Hall effect sensor circuit. The power source connections for the circuit and an output for the measured signal are also connected to a connection contact, which is not specifically shown in the drawing, that is located on the surface of the semiconductor chip 3. One of the connection contacts for the power source and the connection contact for the measured signal are located in the same positions—relative to the outer contour of the respective semiconductor chip 2, 3—as the connection contacts for the first semiconductor chip 2.

The individual semiconductor chips 2, 3 of the wafer 1 are positioned one after another in a reference magnetic field that is generated with the aid of an exciter coil 4 that is supplied with a specified current. The exciter coil 4 has two air coils 5 that are offset axially relative to each other and that are separated from each other by an air gap. In the air gap the semiconductor chips 2, 3 that are located on the wafer 1 are positioned in such a way that the plane in which the wafer extends is normal to the longitudinal axis of the exciter coil 4 and therefore to the field lines of the reference magnetic field.

After one of the semiconductor chips 2, 3 is positioned in the air gap in a centered position relative to the reference magnetic field, the connection contacts of the semiconductor chip 2, 3 are each connected to a needle-shaped matching contact 7a, 7b, 7c of a test instrument 8 that applies a supply voltage to the matching contacts 7a, 7c that is assigned to the connection contacts of the second semiconductor chip 3 provided for the power supply of the second semiconductor chip 3. Then a test is performed to determine whether current is flowing through matching contacts 7a, 7c. If a current is flowing, one of the second semiconductor chips 3 is positioned at the matching contacts 7a, 7c. If no current is flowing, one of the first semiconductor chips 2 is positioned at the matching contacts 7a, 7c.

Figure 5:
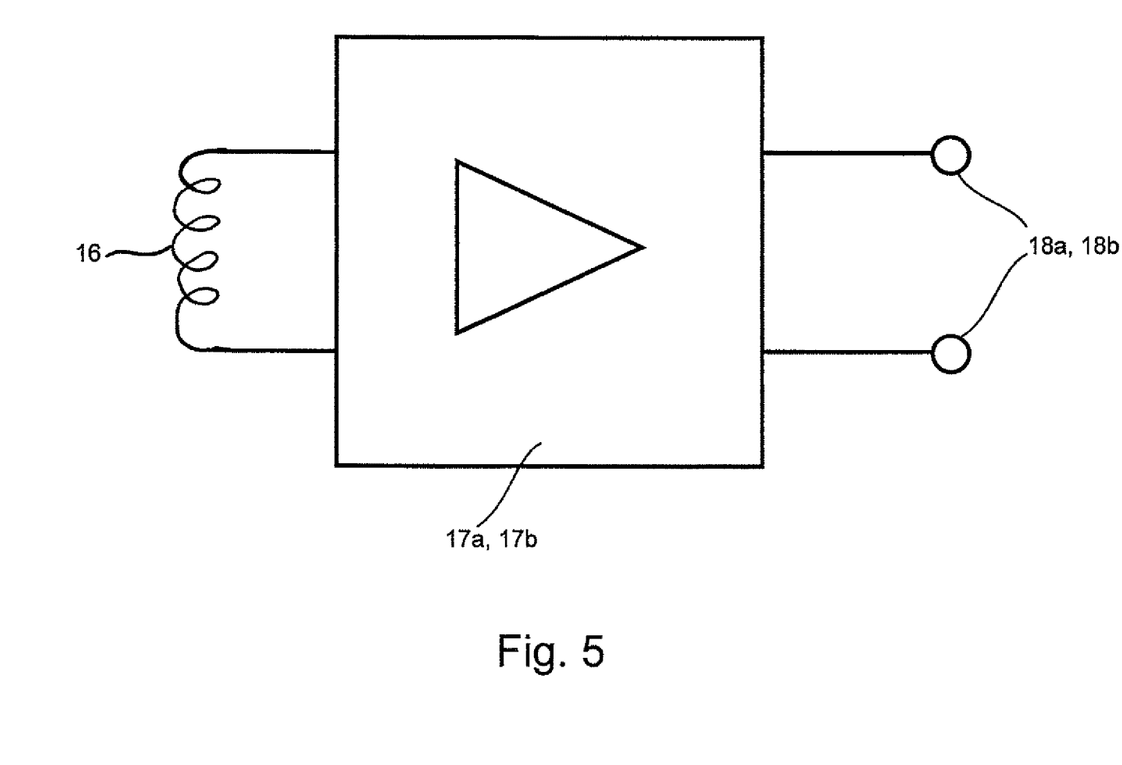

In the text below it is assumed that a measurement coil 16 is integrated into the semiconductor chip 2 that is currently positioned at the exciter coil 4. In this case, an alternating current having a specified amplitude is supplied to the exciter coil 4. The electric voltage that is induced in the measurement coil 16 by the reference magnetic field that is generated in this manner is measured via the matching contacts 7a, 7b that are connected to the ends of the measurement coil 16 and is sent via an impedance converter 17a to a measured signal input 18a of the test instrument 8 (FIG. 5). It is even possible for the impedance converter 17a, 17b to be integrated into the semiconductor chip 2. The impedance converter 17a attenuates or suppresses any high-impedance interference that may interfere with the working signal.

The value that is measured at the measured signal input is compared with a first reference value range.

If a deviation between the measured value and the first reference value range is found, the current fed into the exciter coil 4 is changed in an effort to reduce the deviation. Then an additional measured value is acquired and compared with the first reference value range. If a deviation is once again found, the steps set forth above are repeated as necessary at least one time.

If the measured value agrees with the first reference value range, a second semiconductor chip 3 is positioned at the exciter coil 4. To accomplish this, the wafer 1 is moved parallel to its plane of extension in one or two directions that are perpendicular to each other. In addition, the second semiconductor chip 3 is brought to a specified first test temperature.

The exciter coil 4 is supplied with a direct current whose amperage corresponds to the amplitude of the most recently set alternating current. Then the supply voltage is attached to the Hal circuit via matching contacts 7a, 7c. A measured value for the magnetic flux density is supplied to the test instrument 8 via the matching contacts 7b, 7c, which are connected to the measured signal output, and this measured value is compared with a second reference value range.

If a deviation between the measured value and the second reference value range is encountered, the measurement characteristic curves of the Hall effect sensor circuit are changed in an effort to reduce the deviation. In order to change the measurement characteristic curves, a programming voltage is applied between a least two matching contacts 7a, 7b, 7c. Then an additional measured value is acquired and compared with the second reference value range. If a deviation is encountered again, the steps set forth above may be repeated at least one time.

If, despite repeated changes of the measurement characteristic curves, the measured value does not coincide with the second reference value range, the second semiconductor chip is marked with a color to indicate that it is defective. If no deviation is found between the measured value and the second reference value range, the second semiconductor chip 3 is brought to a specified second test temperature, and the steps set forth above are repeated in a corresponding manner.

Then the next semiconductor chip 2, 3 is positioned at the exciter coil 4, and the steps set forth above are performed again.

After a series of semiconductor chips 2, 3 has been processed, the semiconductor chips 2, 3 that are located in this row are separated from the wafer 1 and singulated. Any semiconductor chips 2, 3 that were marked as defective are then culled out.

Figure 3:
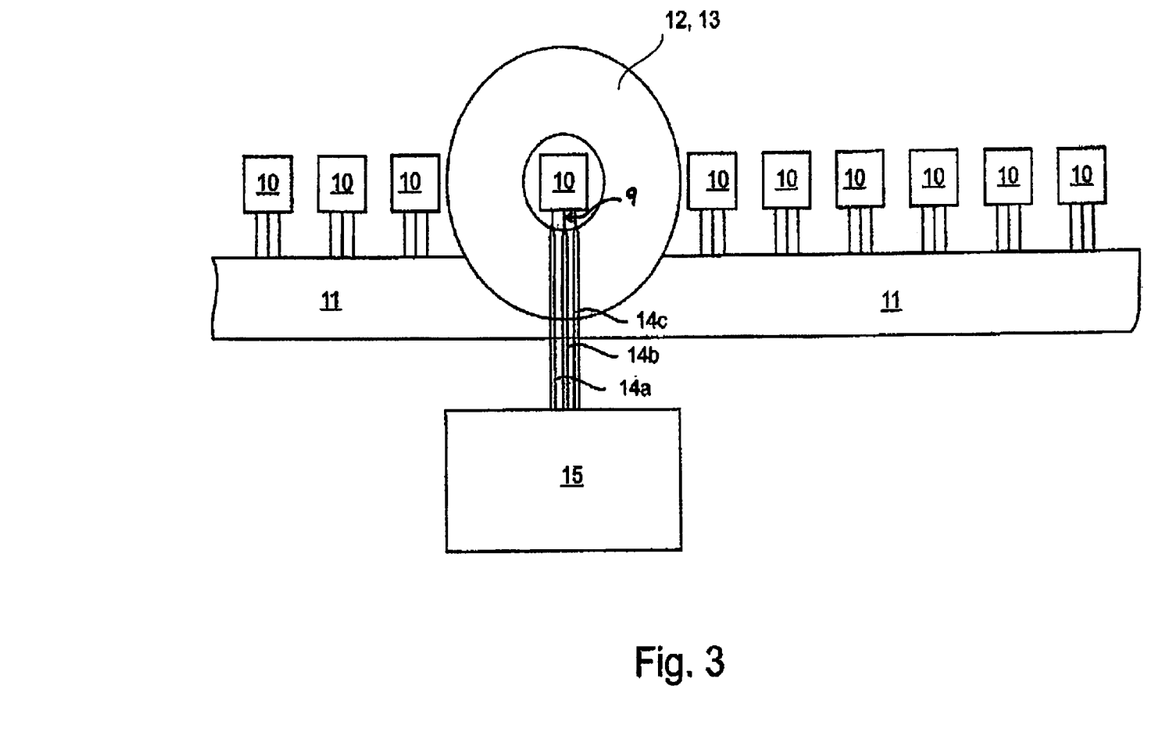
Figure 4:
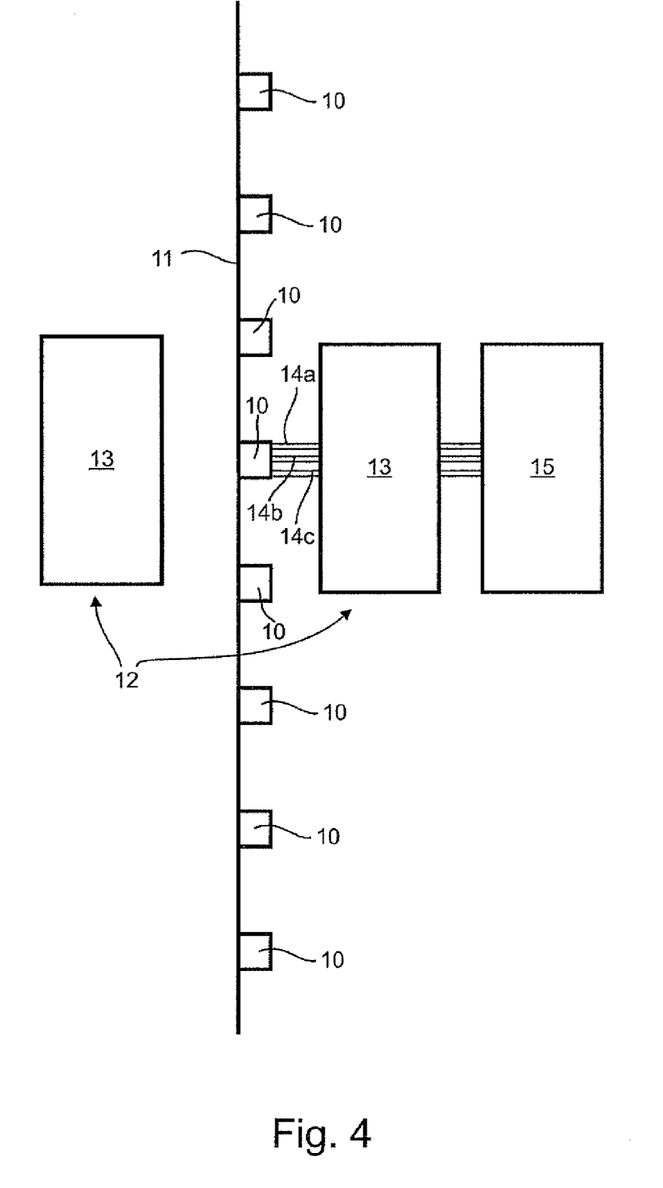

The connection contacts of the remaining tested semiconductor chips 2, 3 are connected to contact lugs 9 provided on a lead frame by means of bond wires in a manner that is known per se, and a sensor housing 10 is molded around them in such a way that the contact lugs 9 project out of the sensor housing 10. The contact lugs 9 and the sensor housing 10 have the same design for the various semiconductor chips 2, 3. The components manufactured in this way are lined up on a belt 11 spaced at equal distances from each other.

Then the components are positioned one after another in a second reference magnetic field that is generated with the aid of a second exciter coil 12 that is supplied with a specified current. The second exciter coil 12 has two second air coils 13 that are offset axially relative to each other and that are separated from each other by an air gap. The components containing the semiconductor chips 2, 3 are positioned in the air gap in such a way that the plane in which the semiconductor chips 2, 3 extend is normal to the longitudinal axis of the exciter coil 12 and is therefore normal to the field lines of the reference magnetic field.

After one of the components has been positioned in the air gap, the contact lugs 9 of the component are each connected to a needle-shaped second matching contact 14a, 14b, 14c of a second test instrument 15 that applies a supply voltage to the second matching contacts 14a, 14c. Then a test is performed to determine whether a current is flowing through the second matching contacts 14a, 14c. If a current is flowing, a magnetic field sensor is located at the second exciter coil 12. If not, a component having a measurement coil 16 is present.

In the text below it is assumed that a component having a measurement coil 16 is positioned at the exciter coil 12. In this case, an alternating current having a specified amplitude is supplied to second exciter coil 12. The electric voltage that is induced in the measurement coil 16 by the reference magnetic field that is generated in this manner is picked off the second matching contacts 14a, 14b that are connected to the ends of the measurement coil 16. This voltage is read and is sent via a second impedance converter 17b to a measured signal input 18b of the second test instrument 15 (FIG. 5). The value measured at the measured signal input is compared with the first reference value range.

If a deviation is encountered between the measured value and the first reference value range, the current supplied to the second exciter coil 12 is changed in an effort to reduce the deviation. Then an additional measured value is acquired and compared with the first reference value range. If the deviation is found again, the steps set forth above are repeated at least one time.

If the measured value coincides with the first reference value range, the component having the measurement coil 16 is removed from the belt 11, and a magnetic field sensor is positioned at the exciter coil 4. To do this, the belt is moved by one part in the longitudinal direction. In addition, the respective magnetic field sensor is brought to the first test temperature.

The second exciter coil 12 is supplied with a direct current whose amperage corresponds to the amplitude of the alternating current that was most recently set at the second exciter coil. Then the supply voltage is applied to the Hall circuit via the second matching contacts 14a, 14c. A measured value for the magnetic flux density is fed into the second test instrument 15 via the matching contacts 14a, 14c, which are connected to the measured signal output, and this measured value is compared with a second reference value range.

If a deviation between the measured value and the second reference value range is encountered, the measurement characteristic curves of the Hall effect sensor circuit are changed in an effort to reduce the deviation. In order to change the measurement characteristic curves, a programming voltage is applied between at least two of the second matching contacts 14a, 14b, 14c. Then an additional measured value is acquired and compared with the second reference value range. If a deviation is encountered again, the steps set forth above may be repeated at least one time.

If, despite repeated attempts to change the measurement characteristic curves, the measured value does not coincide with the second reference value range, the respective component is removed from the belt 11 and culled out. If no deviation is found, the second semiconductor chip 3 is brought to the second test temperature, and the steps set forth above are repeated in a corresponding manner.

Then the next semiconductor chip 2, 3 is positioned at the second exciter coil 12, and the steps set forth above are performed again.

The invention claimed is:

1. A method for testing a measurement accuracy of at least one magnetic field sensor having a semiconductor wafer with at least one first semiconductor chip and at least one second semiconductor chip, wherein a measurement coil is integrated into the at least one first semiconductor chip, and a magnetic field-sensitive electric circuit is integrated into the at least one second semiconductor chip, the method comprising:

positioning the at least one first semiconductor chip at an exciter coil, supplying the exciter coil with a current in order to generate a reference magnetic field having a magnetic flux density, acquiring, with the aid of the measurement coil, a first measured value that is dependent on the magnetic flux density, adjusting the current in the exciter coil depending on the first measured value to form an adjusted magnetic flux density, positioning the at least one second semiconductor chip at the exciter coil, acquiring, with the aid of the electric circuit, a second measured value that is dependent on the adjusted magnetic flux density, and comparing said second measured value with a reference value range.

2. A method to test a measurement accuracy of at least one magnetic field sensor having a semiconductor wafer with at least one first semiconductor chip and at least one second semiconductor chip, wherein a measurement coil is integrated into the at least one first semiconductor chip, and a magnetic field-sensitive electric circuit is integrated into the at least one second semiconductor chip to form a magnetic field sensor, the method comprising:

positioning the at least one first semiconductor chip at an exciter coil, applying current to the exciter coil in order to generate a first reference magnetic field having a magnetic flux density, acquiring, with the aid of the measurement coil, a first measured value that is dependent on the magnetic flux density, providing, depending on the first measured value, a reference value range, positioning the at least one second semiconductor chip at the exciter coil, acquiring a second measured value that is dependent on the magnetic flux density with the aid of the electric circuit, and comparing the second measured value with the reference value range.

3. The method of claim 1 wherein the at least one second semiconductor chip includes a plurality of second semiconductor chips, and the plurality of second semiconductor chips are marked depending on a result of a comparison between the second measured value and the reference value range and are then singulated and sorted according to their markings.

4. The method of claim 1 wherein the magnetic field-sensitive electric circuit is configured in such a way that at least two different measurement characteristics can be adjusted, and an adjustment of the measurement characteristics is performed according to a result of a comparison between the second measured value and the reference value range.

5. The method of claim 1 wherein the at least one first semiconductor chip includes a plurality of first semiconductor chips and the at least second semiconductor chip includes a plurality of second semiconductor chips, and wherein a ratio of a number of the plurality of second semiconductor chips which are located on the wafer to a number of the plurality of first semiconductor chips which are located on the wafer is greater than 1.

6. The method of claim 1 wherein the at least one first semiconductor chip and the at least one second semiconductor chip are singulated and each singulated semiconductor chip is optionally enclosed in a sensor housing after or before it is positioned at the exciter coil.

7. The method of claim 6 wherein the at least one first semiconductor chip is separated from the at least one second semiconductor chip before being installed in the sensor housing.

8. The method of claim 6 wherein the singulated semiconductor chips are placed in a row on a belt, and the belt is moved to move the singulated semiconductor chips to and past a second exciter coil.

9. The method of claim 1 wherein connections of the measurement coil of the at least one first semiconductor chip are each connected to first connection contacts, and connections of the electric circuit integrated into the at least one second semiconductor chip are each connected to second connection contacts, a position of the first connection contacts relative to the at least one first semiconductor chip corresponds to a position of the second connection contacts relative to the at least one second semiconductor chip or a portion of the second connection contacts, and the first or second connection contacts are contacted with matching contacts connected to a test instrument during or after the positioning of the at least one first or at least one second semiconductor chip at the exciter coil.

10. The method of claim 1 wherein after the second measured value is acquired, a temperature of the at least one second semiconductor chip is changed, and thereafter at least one additional second measured value is acquired and compared with the reference value range.

11. The method of claim 1 wherein the exciter coil is supplied with an alternating current while the at least one first semiconductor chip is positioned at the exciter coil, and is supplied with a direct current while the at least one second semiconductor chip is positioned at the exciter coil.

12. The method of claim 2 wherein the at least one second semiconductor chip includes a plurality of second semiconductor chips, and the plurality of second semiconductor chips are marked depending on a result of the comparison between the second measured value and the reference value range and are then singulated and sorted according to their markings.

13. The method of claim 2 wherein the magnetic field-sensitive electric circuit is configured in such a way that at least two different measurement characteristics can be adjusted, and an adjustment of the measurement characteristics is performed according to a result of a comparison between the second measured value and the reference value range.

14. The method of claim 2 wherein the at least one first semiconductor chip includes a plurality of first semiconductor chips and the at least second semiconductor chip includes a plurality of second semiconductor chips, and wherein a ratio of a number of the plurality of second semiconductor chips which are located on the wafer to a number of the plurality of first semiconductor chips which are located on the wafer is greater than 1.

15. The method of claim 2 wherein the at least one first semiconductor chip and the at least one second semiconductor chip are singulated and each singulated semiconductor chip is optionally enclosed in a sensor housing after or before it is positioned at a second exciter coil.

16. The method of claim 15 wherein the at least one first semiconductor chip is separated from the at least one second semiconductor chip before being installed in the sensor housing.

17. The method of claim 15 wherein the singulated semiconductor chips are placed in a row on a belt, and the belt is moved in to move the singulated semiconductor chips past the second exciter coil.

18. The method of claim 2 wherein connections of the measurement coil of each of the at least one first semiconductor chip are each connected to first connection contacts, and connections of the electric circuit integrated into the at least one second semiconductor chip are each connected to second connection contacts, a position of the first connection contacts relative to the at least one first semiconductor chip corresponds to a position of the second connection contacts relative to the at least one second semiconductor chip or a portion of the second connection contacts, and the first or second connection contacts are contacted with matching contacts connected to a test instrument during or after the at least one first or at least one second semiconductor chip is positioned at the exciter coil.

19. The method of claim 2 wherein after the second measured value is acquired, a temperature of the at least one second semiconductor chip is changed, and thereafter at least one additional second measured value is acquired and compared with the reference value range.

20. The method of claim 2 wherein the exciter coil is supplied with an alternating current while the at least one first semiconductor chip is positioned at the exciter coil, and is supplied with a direct current while the at least one second semiconductor chip is positioned at the exciter coil.

21. The method of claim 5 wherein the ratio is greater than 10.

22. The method of claim 5 wherein the ratio is greater than 20.

23. The method of claim 5 wherein the ratio is greater than 40.

24. The method of claim 14 wherein the ratio is greater than 10.

25. The method of claim 14 wherein the ratio is greater than 20.

26. The method of claim 14 wherein the ratio is greater than 40.

27. A method for testing a measurement accuracy of a magnetic field sensor, comprising:
   a) providing a semiconductor wafer having at least one first semiconductor chip and at least one second semiconductor chip, the at least one first semiconductor chip having an integrated measurement coil, and the at least one second semiconductor chip having an integrated magnetic field-sensitive electric circuit, said electric circuit forming the magnetic field sensor;
   b) positioning one of said at least one first semiconductor chip at an exciter coil, and supplying said exciter coil with a current to generate a reference magnetic field having a magnetic flux density at said measurement coil of said at least one first semiconductor chip, and acquiring a first measured value that is dependent on said magnetic flux density at said measurement coil;
   c) adjusting the current supplied to said exciter coil based on said first measured value to form an adjusted magnetic flux density;
   d) positioning the at least one second semiconductor chip at said exciter coil and using the adjusted magnetic flux density at the electric circuit of said at least one second semiconductor chip, and acquiring a second measured value that is dependent on said adjusted magnetic flux density at said electric circuit; and
   e) comparing said second measured value with a reference value range.

28. A method for testing a measurement accuracy of a magnetic field sensor, comprising:
   a) providing a semiconductor wafer having at least one first semiconductor chip and at least one second semiconductor chip, the at least one first semiconductor chip having an integrated measurement coil, and the at least one second semiconductor chip having an integrated magnetic field-sensitive electric circuit, said electric circuit forming the magnetic field sensor;
   b) positioning one of said at least one first semiconductor chip at an exciter coil, and supplying said exciter coil with a current to generate a reference magnetic field having a magnetic flux density at said measurement coil of said at least one first semiconductor chip, and acquiring a first measured value that is dependent on said magnetic flux density at said measurement coil;
c) providing a reference value range based on said first measured value;
d) positioning the at least one second semiconductor chip at said exciter coil to form a magnetic flux density at said electric circuit of said at least one second semiconductor chip, and acquiring a second measured value that is dependent on said magnetic flux density at said electric circuit; and
e) comparing said second measured value with said reference value range.

* * * * *